United States Patent
Sugai

Patent Number: 6,114,236
Date of Patent: Sep. 5, 2000

[54] PROCESS FOR PRODUCTION OF SEMICONDUCTOR DEVICE HAVING AN INSULATING FILM OF LOW DIELECTRIC CONSTANT

[75] Inventor: Kazumi Sugai, Tokyo, Japan

[73] Assignee: NEC Corporation, Japan

[21] Appl. No.: 08/946,224

[22] Filed: Oct. 7, 1997

[30] Foreign Application Priority Data

Oct. 17, 1996 [JP] Japan ................... 8-274786

[51] Int. Cl.[7] ............ H01L 21/4763; H01L 21/44; H01L 21/31; H01L 21/469
[52] U.S. Cl. ............ 438/637; 438/623; 438/672; 438/688; 438/780; 438/927
[58] Field of Search .................. 438/623, 637, 438/672, 688, 780, 927

[56] References Cited

U.S. PATENT DOCUMENTS

| | | | |
|---|---|---|---|
| 5,429,995 | 7/1995 | Nishiyama | 437/238 |
| 5,614,439 | 3/1997 | Murooka | 438/637 |
| 5,641,581 | 6/1997 | Nishiyama | 428/688 |
| 5,783,483 | 7/1998 | Gardner | 438/637 |
| 5,837,604 | 11/1998 | Jun | 438/641 |

FOREIGN PATENT DOCUMENTS

| | | | |
|---|---|---|---|
| 60-1869 | 1/1985 | Japan | H01L 29/78 |
| 63-208248 | 8/1988 | Japan | H01L 21/90 |
| 62-196870 | 8/1989 | Japan | H01L 29/78 |
| 3-27526 | 2/1991 | Japan | H01L 21/3205 |
| 3-227021 | 10/1991 | Japan | H01L 21/3205 |
| 5283542 | 10/1993 | Japan | H01L 21/90 |
| 6310612 | 11/1994 | Japan | H01L 21/90 |
| 7169833 | 7/1995 | Japan | H01L 21/768 |

OTHER PUBLICATIONS

Extended abstract of the 1993 International Coference on Solid State Devices and Materials; Makuhari; 1993; pp. 180–182.

*Primary Examiner*—Charles Bowers
*Assistant Examiner*—Nema Berezny
*Attorney, Agent, or Firm*—Hayes, Soloway, Hennessey, Grossman & Hage, P.C.

[57] ABSTRACT

A process for producing a semiconductor device having an interlayer insulating film of low dielectric constant and interconnects of low resistance and operable at a high speed, which comprises:

a step of heat-treating a semiconductor substrate having a lower interconnect, a step of depositing, on the heat-treated semiconductor substrate, an insulating film having a dielectric constant of 3.5 or less, a step of making holes in the insulating film, and a step of growing a metal only in the holes by selective chemical vapor deposition.

9 Claims, 3 Drawing Sheets

PROCESS FOR PRODUCTION OF SEMICONDUCTOR DEVICE HAVING AN INSULATING FILM OF LOW DIELECTRIC CONSTANT

BACKGROUND OF THE INVENTION

1. Field of the Invention

The present invention relates to a process for producing a semiconductor device which has an interlayer insulating film of low dielectric constant and interconnects of low resistance and which is operable at a high speed.

2. Description of the Prior Art

Conventional processes for production of semiconductor device include, for example, a process described in Japanese Patent Application Laid-Open No. 196870/1987. This process comprises (1) a step of forming a gate electrode, etc. on a semiconductor substrate, (2) a step of forming thereon an interlayer insulating film, (3) a step of conducting a high-temperature in-$N_2$ heat treatment, (4) a step of forming contact holes in the interlayer insulating film, (5) a step of conducting a high-temperature (450° C. or higher) in-$H_2$ heat treatment, (6) a step of forming an aluminum interconnect, and (7) a step of conducting a low-temperature in-$N_2$ heat treatment. In this process, since the heat treatments (3) and (5) are conducted before the formation of an aluminum interconnect, insufficient contact at the interface between the aluminum interconnect and Si can be prevented and further the surface state such as cause d by the dangling bond of Si can be eliminated.

As processes for production of semiconductor device which comprise a step of growing a metal only in the contact holes by selective chemical vapor deposition, there is, for example, a process described in Extended Abstracts of the 1993 International Conference on Solid State Devices and Materials, Makuhari, 1993, pp. 180–182. In this process, contact holes are formed in an interlayer insulating film composed of $SiO_2$; in each hole is formed an aluminum plug by chemical vapor deposition using $Al(CH_3)_2H$; then, an aluminum film is deposited on the whole surface of the resulting substrate by sputtering. According to this process, there is obtained a structure as shown in FIG. 3, comprising a Si substrate 31, a first $SiO_2$ film 32, a lower aluminum interconnect 33, a second $SiO_2$ film 34 and an upper aluminum interconnect 35, wherein the lower aluminum interconnect 33 and the upper aluminum interconnect 35 are connected with each other via Al plugs 36. This process can provide interconnects of low resistance.

For formation of a wiring when an insulating film of 3.5 or lower dielectric constant is used, there is, for example, a process described in 43rd-OYOUBUTURIGAKUKANKEIRENGO KOENKAIYO-KOSYU No. 2, p751, 27p-Q-14. In this process, as shown in FIG. 4, a groove is formed in a BCB (benzocyclobutene) film 42 provided on a Si substrate 41, and a Cu wiring 43 is formed in the groove.

The above-mentioned prior art, however, has had the following problems.

In the process described in Japanese Patent Application Laid-Open No. 196870/1987, since it is necessary to eliminate, by the low-temperature in-$N_2$ heat treatment step (7) after formation of an aluminum interconnect, the hydrogen of low bonding force from the interface between the gate electrode and the interlayer insulating film and also from the interface between the substrate and the interlayer insulating film, the heat treatment temperature of the step (7) is as high as at least about 400° C. Therefore, in the process, it is impossible to use, as the interlayer insulating film, an organic film of low heat resistance, and accordingly it is impossible to allow the interlayer insulating film to have a low dielectric constant and no LSI of high-speed operation is obtainable.

In the process shown in FIG. 3, since a $SiO_2$ film is used as the interlayer insulating film, the dielectric constant of the film is as high as at least 4 and no LSI of high-speed operation is obtainable.

In the process shown in FIG. 4, since only one layer of wiring is formed, electrical connection between upper and lower wirings is difficult when a multi-layered structure is obtained. Therefore, the process is generally inapplicable in production of a high-speed LSI using multi-level wirings.

SUMMARY OF THE INVENTION

The object of the present invention is to provide a process for producing a semiconductor device which has an interlayer insulating film of low dielectric constant and interconnects of low resistance and which is operable at a high speed.

The above object is achieved by a process for producing a semiconductor device, which comprises:

a step of heat-treating a semiconductor substrate having a lower interconnect, a step of depositing, on the heat-treated semiconductor substrate, an insulating film having a dielectric constant of 3.5 or less, a step of making holes in the insulating film, and a step of growing a metal only in the holes by selective chemical vapor deposition.

In the present process, a MOS transistor is heat-treated for stabilization, prior to the formation of an interlayer insulating film thereon; a low-dielectric constant film of low heat resistance as interlayer insulating film is formed on the heat-treated MOS transistor; contact holes (or via-holes) are formed in the insulating film; single-crystal aluminum is grown in each hole on the portion of the lower interconnect at the bottom of each hole, by selective chemical vapor deposition using an organic aluminum precursor or the like, to completely fill each hole with the single-crystal aluminum; then, an upper interconnect is formed. According to this process, both the adhesivity between the single-crystal aluminum and the lower interconnect and the adhesivity between the single-crystal aluminum and the upper interconnect are high; the interconnects show a sufficiently low (safely usable) resistance when used as interconnects of integrated circuit; both an insulating film of low dielectric constant and interconnects of low resistance can be achieved simultaneously without causing the property deterioration of MOS transistor; thus, a semiconductor device of high-speed operation can be produced.

BRIEF DESCRIPTION OF THE PREFERRED EMBODIMENTS

FIGS. 1(a)–1(d) are sectional views stepwise showing the process for production of a semiconductor device, employed in Example 1 of the present invention. Example 1 is a case where the present process was applied to the wiring step of the production of a silicon integrated circuit.

Figure 1A:
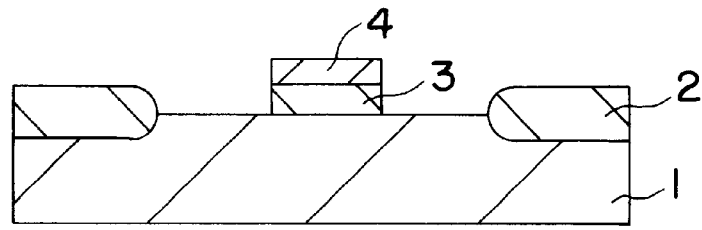
FIGS. 1(a)–1(d) are cross sectional views stepwise showing the process for production of a semiconductor device, employed in Example 1 of the present invention.

First, as shown in FIG. 1(a), there is formed, according to a standard process for production of an integrated circuit, a MOS transistor having, on a Si substrate 1, LOCOS 2, a gate oxide film 3 and a gate electrode 4.

Next, the MOS transistor is subjected to a heat treatment under the conditions of, for example, 400° C.×30 minutes in a hydrogen atmosphere, whereby the dangling bonds of the gate oxide film 3 are eliminated and the interface between the gate oxide film 3 and the substrate 1 is stabilized (this is a heat treatment step).

Figure 1B:
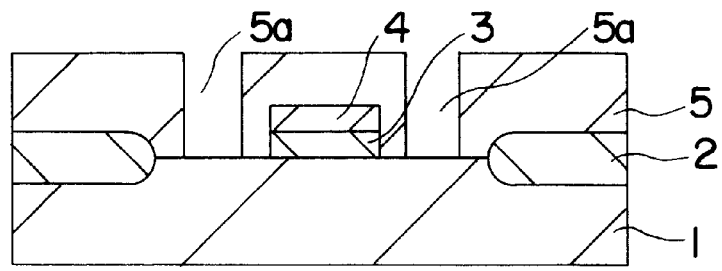

Next, as shown in FIG. 1(b), an insulating film 5 of low dielectric constant, for example, a BCB film having a heat-resistant temperature of 380° C. is formed on the whole surface of the heat-treated MOS transistor (this is an insulating film deposition step).

Next, as shown in FIG. 1(b), contact holes 5a are formed in the insulating film 5 of low dielectric constant, by lithography and etching (this is a hole-making step). This etching can be carried out, for example, by using a mixed gas of argon, $CF_6$ and oxygen and exposing the substrate 1 to a high-frequency plasma of 200 W. In this etching, a contaminant layer (not shown) composed of an oxide, etc. is formed at the bottom of each contact hole 5a; therefore, it is desirable to conduct, after the hole-making step, cleaning by high-frequency plasma etching using a halogen gas.

Figure 1C:
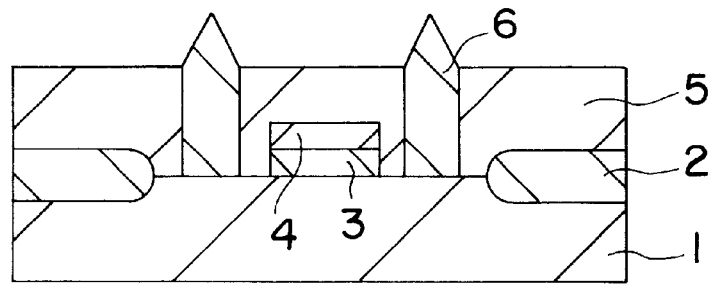

Next, as shown in FIG. 1(c), an Al plug 6 is grown only in each contact hole 5a (this is a selective chemical vapor deposition step). This selective chemical vapor deposition can be carried out, for example, by introducing, into an apparatus for chemical vapor deposition, dimethylaluminum hydride [$Al(CH_3)_2H$] together with a carrier gas (hydrogen gas, inert gas or the like of 300 sccm flow rate) and keeping the total pressure inside the apparatus at 1.3 Torr, the partial pressure of dimethylaluminum hydride inside the apparatus at 0.3 Torr, and the substrate temperature at 200° C. or lower. In this step, since the substrate temperature is kept well below the heat-resistant temperature of the low dielectric constant insulating film 5, there occurs no property deterioration of the low dielectric constant insulating film 5.

Figure 1D:
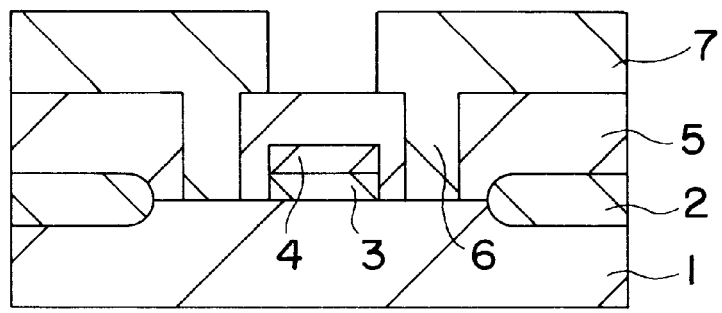

Next, an Al—Cu film is formed by sputtering. Then, as shown in FIG. 1(d), a first Al interconnect 7 is formed by lithography and etching.

By the above steps, good electrical connection is achieved at the interface between the Al plug 6 and the Si substrate 1 and also at the interface between the Al plug 6 and the first Al interconnect 7.

In this Example 1, when contact holes 5a of 0.2 μm in diameter were formed, the contact resistance was 150 Ω in the case of n type and 300 Ω in the case of type. when successively a 200° C. heat treatment was conducted in a hydrogen atmosphere, the contact resistance dropped to 130 Ω in the case of n type and to 260 Ω in the case of p type. Thus, the heat treatment reduced the contact resistance The steps after this heat treatment are ordinarily carried out, in a standard process, by keeping the substrate at a temperature lower than the heat-resistant temperature of the low dielectric constant insulating film 5; therefore, there occurs no property deterioration of the low dielectric constant insulating film 5.

Thus, a combination of an interlayer insulating film of low dielectric constant and interconnects of low resistance has been made possible. As a result, wire delay time of LSI can be reduced substantially and high-speed operation is achieved. Further, in Example 1, since each contact hole 5a is filled with single-crystal Al, interconnects of high electromigration resistance can be obtained without adding any impurity. In Example 1, wire delay time w as improved by 30% as compared with a conventional level.

FIGS. 2(a)–2(d) are sectional views stepwise showing the process for production of a semiconductor device, employed in Example 2 of the present invention. Example 2 is a case where the present process was applied to the multi-level wiring step of the production of silicon integrated circuit.

Figure 2A:
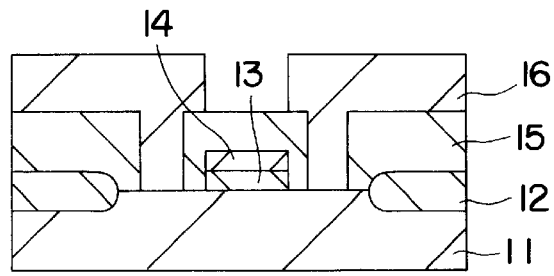
FIGS. 2(a)–2(d) are cross sectional views stepwise showing the process for production of a semiconductor device, employed in Example 2 of the present invention.

First, as shown in FIG. 2(a), there is formed, according to a standard process for production of integrated circuit, a MOS transistor having, on a Si substrate 11, LOCOS 12, a gate oxide film 13, a gate electrode 14, an interlayer insulating film 15 composed of $SiO_2$ and a first Al interconnect 16.

Next, the same heat treatment as in Example 1 is carried out to stabilize the interface between the gate oxide film 13 and the substrate 11 (this is a heat treatment step).

Figure 2B:
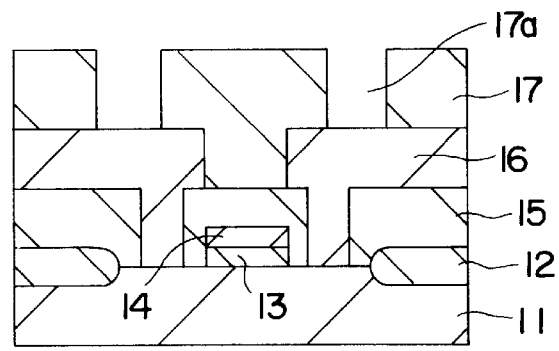

Next, as shown in FIG. 2(b), as an insulating film 17 of low dielectric constant, for example, a BCB film having a heat-resistant temperature of 380° C. is formed on the whole surface of the heat-treated MOS transistor (this is an insulating film deposition step).

Next, as shown in FIG. 2(b), via-holes 17a are formed in the insulating film 17 of low dielectric constant, by lithography and etching (this is a hole-making step). This etching can be carried out in the same manner as in Example 1. In this etching, a contaminant layer (not shown) composed of an oxide, etc. is formed at the bottom of each via-hole 17a; therefore, it is desirable to conduct, after the hole-making step, cleaning by high-frequency plasma etching using HCl gas. By this cleaning, the contaminant layer on the first Al interconnect 16 is removed and a clean Al surface appears.

Figure 2C:
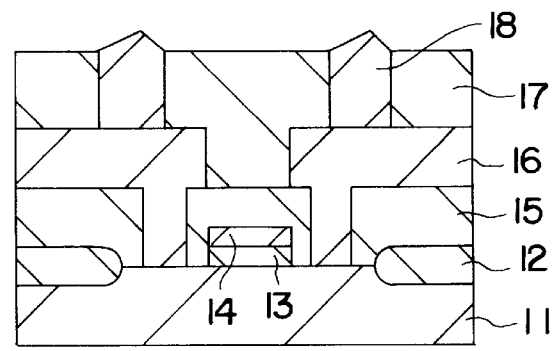

Next, as shown in FIG. 2(c), an Al plug 18 is grown only in each via-hole 17a (this is a selective chemical vapor deposition step). This selective chemical vapor deposition can be carried out, for example, by introducing, into an apparatus for chemical vapor deposition, dimethylethylaminealane [$N(CH_3)_2(C_2H_5)AlH_3N(CH_3)_2CH(C_2H_5)$] together with a carrier gas (hydrogen gas, inert gas or the like of 500 sccm flow rate) and keeping the total pressure inside the apparatus at 10 Torr, the partial pressure of dimethylethylaminealane inside the apparatus at 0.1 Torr, and the substrate temperature at 200° C. or lower. In this step, since the substrate temperature is kept well below the heat-resistant temperature of the low dielectric constant insulating film 17, there occurs no property deterioration of the low dielectric constant insulating film 17.

Figure 2D:
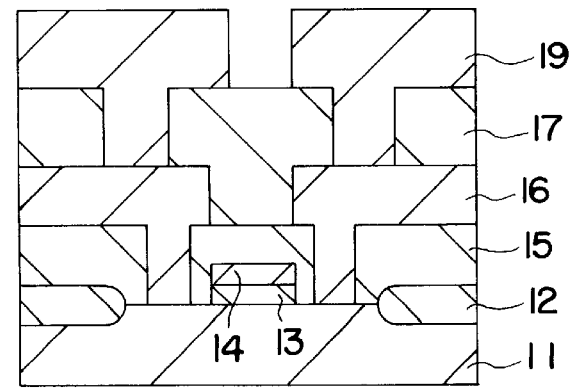
Figure 3:
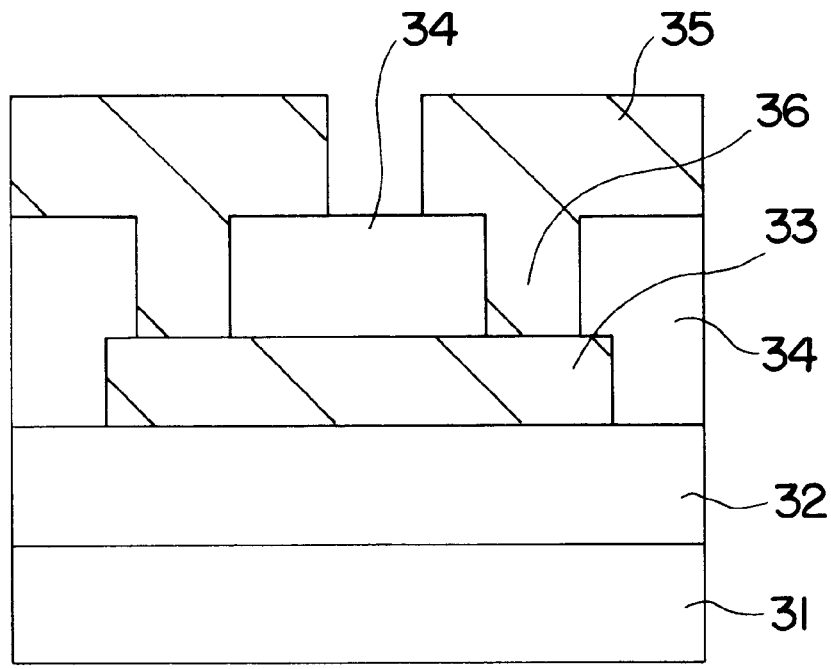
FIG. 3 is a cross sectional view showing an example of the semiconductor device after completion of wiring step, produced according to a conventional process for semiconductor device production.
Figure 4:
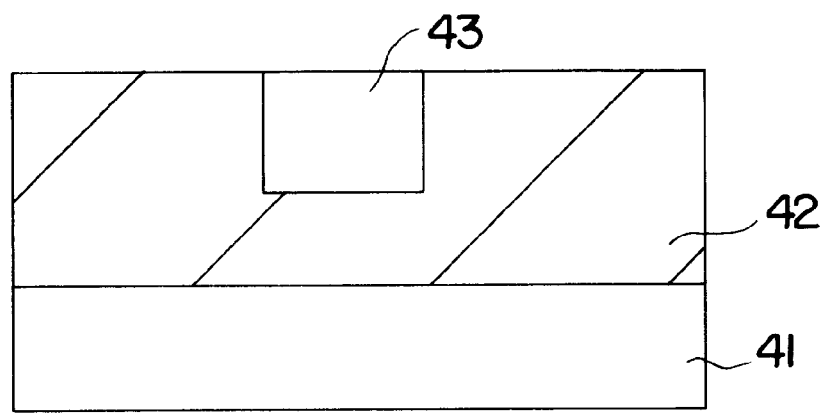
FIG. 4 is a cross sectional view showing another example of the semiconductor device after completion of wiring step, produced according to a conventional process for semiconductor device production.

Next, an Al—Cu film is formed by sputtering. Then, as shown in FIG. 2(d), a second Al interconnect 19 is formed by lithography and etching.

By the above steps, good electrical connection is achieved at the interface between the Al plug 18 and the first Al interconnect 16 and also at the interface between the Al plug 18 Al and the second Al interconnect 19.

In this Example 2, when via-holes 17a of 0.4 μm in diameter were formed, the via-hole resistance was 0.3 Ω. The interface resistance of the via-holes of 0.4 μm in diameter was 0.05 Ω. When successively a 250° C. heat treatment was conducted in a hydrogen atmosphere, the interface resistance dropped to 0.01 Ω. Thus, the heat treatment reduced the interface resistance.

The steps after this heat treatment are ordinarily carried out, in a standard process, by keeping the substrate at a temperature lower than the heat-resistant temperature of the low dielectric constant insulating film 17; therefore, there occurs no property deterioration of the low dielectric constant insulating film 17.

In Example 2 as well, high-speed operation of LSI is achieved and interconnects of high electromigration resistance can be obtained. Moreover, in Example 2, satisfactory multi-level interconnects can be obtained.

In the above Examples 1 and 2, $CF_6$ was used as an etching gas in the hole-making step. In the present invention, the etching gas used in the hole-making step is not restricted thereto and there can be used various etching gases such as $SF_6$, $PF_3$, $PF_5$, $C_3F_8$, $CHF_3$, $NF_3$, $C_2ClF_5$, $SF_4$ and the like. Depending upon the kind of the low dielectric constant insulating film used, the etching gas used in the hole-making step may be chlorine-based gases such as $BCl_3$, HCl, $Cl_2$, $AlCl_3$ and the like, and these chlorine-based gases serve al so for the removal of contaminant layer.

In Example 2, HCl gas was used as a gas for cleaning. Besides HCl gas, there can be used, for the cleaning, other chlorine-based gases such as $BCl_3$, $Cl_2$, $CCl_4$ and the like.

The material for Al usable in the present invention is not restricted to the materials for Al used in Examples 1 and 2. There can also be used, as the material gas for Al, for example, compounds represented by $R^1_n AlH_{3-n}$ ($R^1$ is a saturated hydrocarbon group, and n is an integer of 1—3), $R^1_n R^2_m AlH_{3-(n+m)}$ ($R^1$ and $R^2$ are each a saturated hydrocarbon group, and n and m are each an integer of 1 or more with a proviso that n+m is an integer of 3 or less) or $R^1 R^2 R^3 Al$ ($R^1$, $R^2$ and $R^3$ are each a saturated hydrocarbon group), and mixtures thereof. Of these, particularly preferred are $Al(CH_3)_3$, $Al(C_2H_5)_3$, $Al(CH_3)_2H$, $Al(i-C_4H_9)_3$, $Al(n-C_3H_7)_3$, $Al(n-C_4H_9)_3$, $Al(C_2H_5)_2H$, etc.

Also preferred are amine adducts of aluminum hydride ($AlH_3$), such as $N(CH_3)_2(C_2H_5)AlH_3 N(CH_3)_2 CH(C_2H_5)$, $N(CH_3)_3 AlH_3$, $[N(CH_3)_3]_2 AlH_3$, $N(C_2H_5)_3 AlH_3$ and the like.

The low dielectric constant insulating film usable in the present invention is not restricted to a BCB film used in Examples 1 and 2. The low dielectric constant insulating film can be any insulating film as long as it has a dielectric constant of 3.5 or less, and there can be used various organic films and amorphous films, such as those composed of parylene, polyimide, cytop, polyquinoline, SIOF or the like.

The temperature for Al plug formation, usable in the present invention is not restricted to those used in Examples 1 and 2. The temperature for Al plug formation can be any temperature as long as it allows for selective chemical vapor deposition of Al and is not higher than the heat-resistant temperature of the low dielectric constant insulating film. The temperature can be appropriately determined depending upon the kind of material for Al, etc.

What is claimed is:

1. A process for producing a semiconductor device, which comprises the steps in sequence of:
   conducting a first heat treatment of a semiconductor substrate having a lower interconnect,
   depositing, on the heat-treated semiconductor substrate, an insulating film having a dielectric constant of 3.5 or less,
   making holes in the insulating film,
   growing a metal only in the holes by selective chemical vapor deposition, and
   conducting a second heat treatment at a temperature not higher than the heat-resistant temperature of the insulating film.

2. A process according to claim 1, wherein the insulating film is an organic film or an amorphous film.

3. A process according to claim 1, wherein the metal grown in the holes is aluminum.

4. A process according to claim 3, wherein there is used, as the material for the metal grown in the holes, at least one compound selected from the group consisting of a compound represented by $R^1_n AlH_{3-n}$ (wherein $R^1$ is a saturated hydrocarbon group, and n is an integer of 1—3), $R^1_n R^2_m AlH_{3-(n+m)}$ (wherein $R^1$ and $R^2$ are each a saturated hydrocarbon group, and n and m are each an integer of 1 or more with a proviso that n+m is an integer of 3 or less) and $R^1 R^2 R^3 Al$ (wherein $R^1$, $R^2$ and $R^3$ are each a saturated hydrocarbon group).

5. A process according to claim 4, wherein the material for the metal growing in the holes is at least one compound selected from the group consisting of $Al(CH_3)_3$, $Al(C_2H_5)_3$, $Al(CH_3)_2H$, $Al(i-C_4H_9)_3$, $Al(n-C_3H_7)_3$, $Al(n-C_4H_9)_3$ and $Al(C_2H_5)_2H$.

6. A process according to claim 3, wherein the raw material for the metal grown in the holes is an amine adduct of an aluminum hydride ($AlH_3$).

7. A process according to claim 6, wherein the amine adduct of an aluminum hydride ($AlH_3$) is at least one compound selected from the group consisting of $N(CH_3)_2(C_2H_5)AlH_3 N(CH_3)_2 CH(C_2H_5)$, $N(CH_3)_3 AlH_3$, $[N(CH_3)]_2 AlH_3$ and $N(C_2H_5)_3 AlH_3$.

8. The process according to claim 1, wherein said second heat treatment is conducted at a temperature of no more than 200° C.

9. The process according to claim 1, wherein said second heat treatment is conducted at a temperature of no more than 250° C.

* * * * *